(12) United States Patent
Taguchi

(10) Patent No.: US 6,448,504 B1
(45) Date of Patent: Sep. 10, 2002

(54) PRINTED CIRCUIT BOARD AND SEMICONDUCTOR PACKAGE USING THE SAME

(75) Inventor: Sawori Taguchi, Oita (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/330,939

(22) Filed: Jun. 11, 1999

(30) Foreign Application Priority Data

Jun. 11, 1998 (JP) .......................................... 10-163092

(51) Int. Cl.[7] ................................................. H05K 1/03
(52) U.S. Cl. ........................ 174/255; 174/260; 174/261
(58) Field of Search ............................... 174/255, 260, 174/261, 52.1

(56) References Cited

U.S. PATENT DOCUMENTS 5,844,782 A * 12/1998 Fukasawa .................... 361/774
6,046,410 A * 4/2000 Wojnarowski et al. ...... 174/262

\* cited by examiner

*Primary Examiner*—Albert W. Paladini
*Assistant Examiner*—José H. Alcala
(74) *Attorney, Agent, or Firm*—Sonnenschein, Nath & Rosenthal

(57) ABSTRACT

A printed circuit board with a reinforcing pattern. The printed circuit board includes lands formed in a wiring pattern at positions corresponding to formation positions of external connection electrode terminals, a pattern protective film having openings which are opened at the formation positions of the lands; wherein the diameter of each of the openings of the pattern protective film is set to be larger than the outside diameter of each of the lands, and a reinforcing pattern extends outwardly from the outer peripheral edge of each of the lands and the extension end of the reinforcing pattern is covered with the pattern protective film, thereby preventing occurrence of cracks in solder balls formed on the lands and enhancing the shear strength of the solder balls.

10 Claims, 3 Drawing Sheets

PRINTED CIRCUIT BOARD AND SEMICONDUCTOR PACKAGE USING THE SAME

RELATED APPLICATION DATA

The present application claims priority to Japanese Application No. P10-163092 filed Jun. 11, 1998, which application is incorporated herein by reference to the extent permitted by law.

BACKGROUND OF THE INVENTION

The present invention relates to a printed circuit board and a semiconductor package using the printed circuit board.

As one type of semiconductor packages, there is known a BGA (Ball Grid Array) shown in FIG. 1, in which a semiconductor element 2 is mounted on a printed circuit board 1 and an array of solder balls 3 are disposed on the opposed side of the element mounting plane, that is, on the back face of the printed circuit board 1. The semiconductor element 2 is connected to a wiring pattern (not shown) formed on the printed circuit board 1 via bonding wires 4.

While not shown, the wiring pattern, made from a conductive material such as copper, is formed on the back face of the printed circuit board 1 on which the array of solder balls 3 are to be formed, and lands are formed in the wiring pattern. Further, a pattern protective film, such as a solder resist film, is stacked on the back face of the printed circuit board 1 in such a manner that land portions are exposed from the pattern protective film.

The above-described related art structure, however, has a problem. Namely, since the pattern protective film stacked on the back face of the printed circuit board 1 gets on outer peripheral edges of the lands, the solder balls 3 formed on the lands come into contact with the pattern protective film. As a result, when heat is applied to the BGA package, thermal stress due to a difference in thermal expansion between each solder ball 3 and the pattern protective film is applied to the root portion of the solder ball 3 (joining portion of the solder ball 3 to the land) which causes cracks at the root portion of the solder ball 3.

To solve such a problem, there has been proposed a technique shown in FIGS. 2A and 2B, in which the diameter of an opening 6a of the pattern protective film 6 located at the land formation position is set to be larger than the outer shape of the land 7, to ensure a gap between the solder ball 3 formed on the land 7 and a portion of the pattern protective film 6 around the solder ball 3, thereby preventing occurrence of cracks in the solder ball 3 due to a difference in thermal expansion.

The above technique, however, has another problem. As the land 7 is separated from the pattern protective film 6, the shear strength of the solder ball 3 is formed on the land 7 becomes weak, thereby reducing the reliability at the time of mounting the BGA package on a mother board or the like.

SUMMARY OF THE INVENTION

An object of the present invention is to provide a printed circuit board capable of preventing occurrence of cracks in external connection electrode terminals (for example, solder balls) formed on lands and enhancing the shear strength of the electrode terminals, and to provide a semiconductor package using the printed circuit board.

To achieve the above object, according to the present invention, there is provided a printed circuit board including comprising: lands formed in a wiring pattern at positions corresponding to formation positions of external connection electrode terminals; a pattern protective film having openings which are opened at the formation positions of the lands wherein the diameter of each of the openings of the pattern protective film is set to be larger than the outside diameter of each of the lands, and a reinforcing pattern which extends outwardly from an outer peripheral edge of each of the lands wherein each extension end of the reinforcing pattern is covered with the pattern protective film.

In the printed circuit board having the above configuration, since the diameter of the opening formed in the pattern protective film is set to be larger than the outside diameter of the land, it is possible to ensure, upon formation of the external connection electrode terminal, such as the solder ball on the land, a gap between the external connection electrode terminal and a portion of the pattern protective film around the external connection electrode terminal. Further, since the reinforcing pattern extends outwardly from the outer peripheral edge of the land and the extension end of the reinforcing pattern is covered with the pattern protective film, it is possible, upon formation of the external connection electrode terminal on the land, to suppress the movement of the external connection electrode terminal in the shear direction.

DETAILED DESCRIPTION OF THE PREFERRED EMBODIMENT

Hereinafter, one embodiment of the present invention will be described with reference to the accompanying drawings.

Figure 3A:
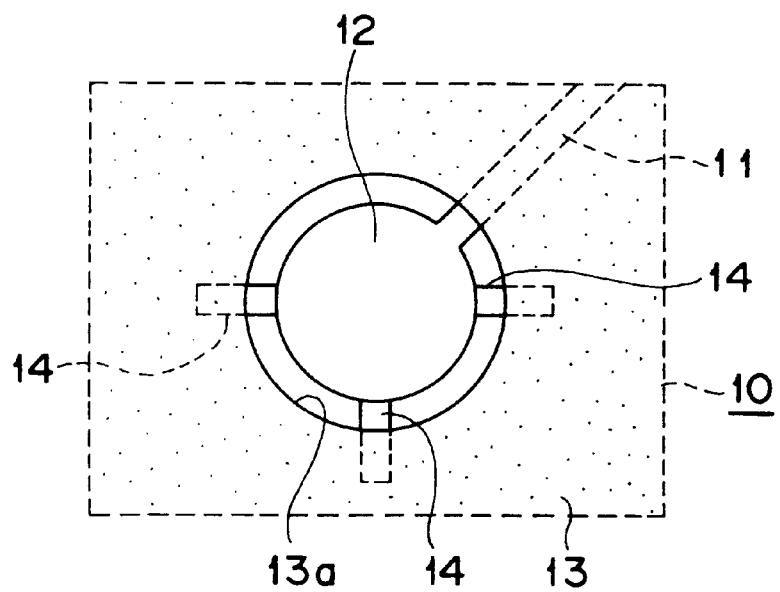
FIGS. 3A and 3B are views illustrating one embodiment of a printed circuit board according to the present invention.
Figure 3B:
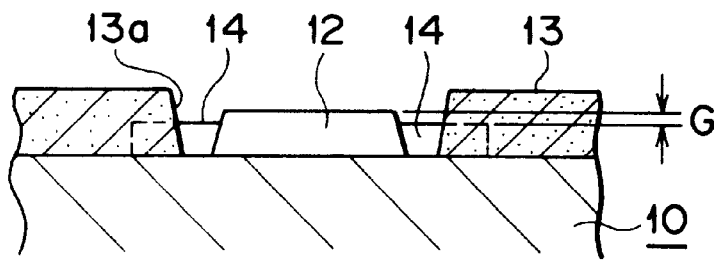

FIGS. 3A and 3B are views illustrating one embodiment of a printed circuit board 10 of the present invention, wherein FIG. 3A is a plan view showing an essential portion of the printed circuit board 10, and FIG. 3B is a sectional side view showing the essential portion shown in FIG. 3A.

Figure 1:
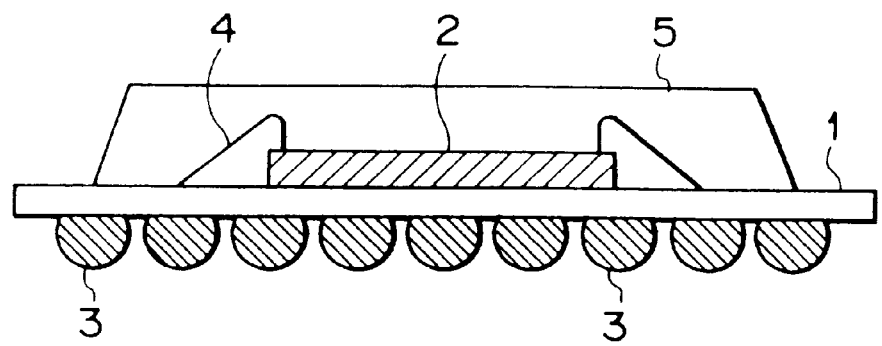
FIG. 1 is a view showing a configuration of a BGA package.
Figure 4:
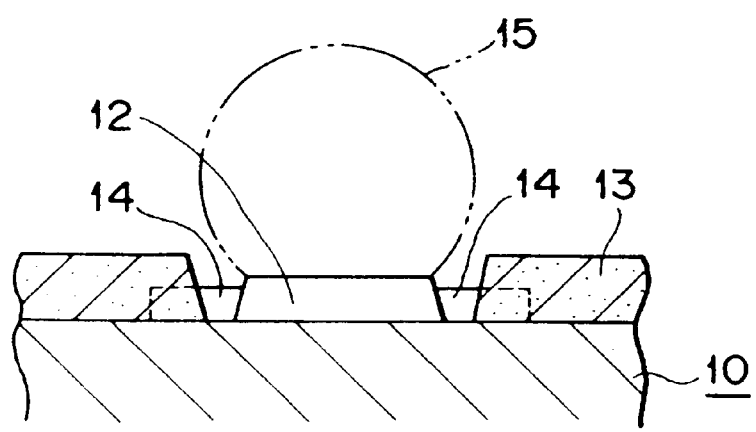
FIG. 4 is a view showing a state in which an electrode terminal is formed on a land on the printed circuit board shown in FIGS. 3A and 3B.
Figure 2A:
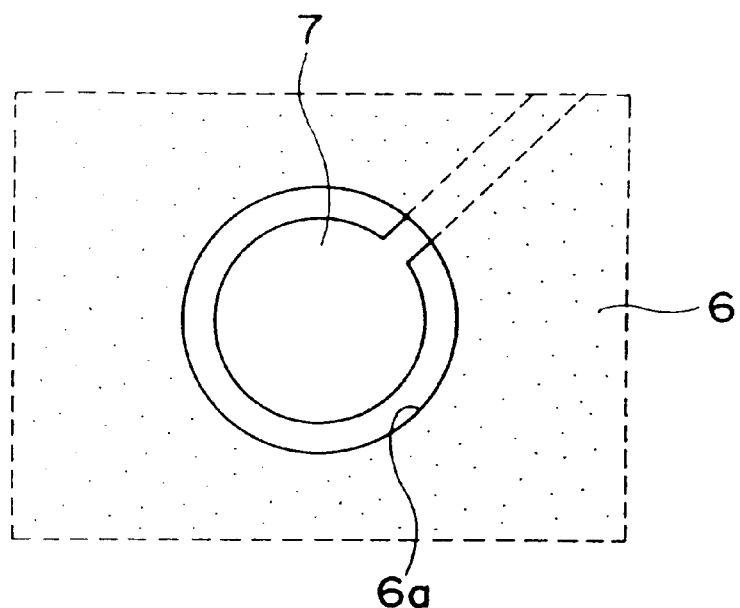
FIGS. 2A and 2B are views illustrating a related art printed circuit board.
Figure 2B:
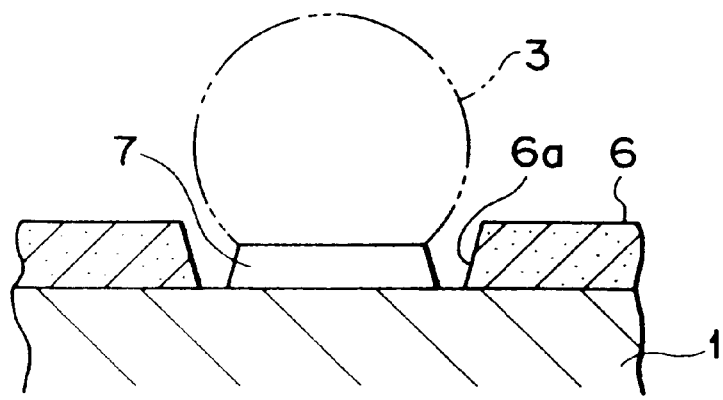

A wiring pattern 11 made from a conductive material such as copper is formed on the surface of the printed circuit board 10 and a circular land 12 is formed at a terminal of the wiring pattern 11 at formation positions of external connection electrode terminals 15 (shown in FIG. 4). Although a number of lands 12 may be actually formed on the printed circuit board 10, only one land 12 is shown in FIGS. 3A and 3B.

A pattern protective film 13 made from an insulating material, such as solder resist, is stacked on the pattern formation plane of the printed circuit board 10 for protecting the wiring pattern 11 formed on the printed circuit board 10 and preventing short-circuits due to solder bridging. The pattern protective film 13 has an opening 13a which is opened at the formation position of the land 12. The diameter of the opening 13a is set to be larger than the outside diameter of the land 12, thereby ensuring a suitable gap between the land 12 and a portion of the pattern protective film 13 around the land 12.

Three reinforcing patterns 14 extend radially outwardly from the outer peripheral edge of the land 12, and extension ends of the reinforcing patterns 14 are covered with the pattern protective film 13. Further, each reinforcing pattern 14 is formed in such a manner as to be lower than the land 12 as measured from the vertical direction from the printed circuit board 10 as shown in FIG. 3B to form a step portion G therebetween. The step portion G is formed by half-etching portions equivalent to the reinforcing patterns 14 upon formation of the wiring pattern 1, lands 12 and the reinforcing patterns 14 by etching.

In the printed circuit bard 10 having the above configuration, since the three reinforcing patterns 14 extend from the outer peripheral edge of the land 12 and the extension ends of the reinforcing patterns 14 are covered with the pattern protective film 13, each of the reinforcing patterns 14 is forcibly supported by the pattern protective film 13.

Referring to FIG. 4, with this configuration, in the case of formation of a BGA package using the printed circuit board 10, it is possible to ensure a gap between the external connection electrode terminal 15 and a portion of the pattern protective film 13 around the external connection electrode terminal 15. In the present invention, the external connection electrode terminal 15 may be a solder ball formed from solder particles or solder paste on the land 12 by heating and fusion. Accordingly, if heat is applied to the BGA package, no thermal stress due to a difference in thermal expansion is applied to the root portion of the solder ball 15, so that it is possible to certainly prevent occurrence of cracks at the root portion of the solder ball 15.

Further, since the movement of the solder ball 15 formed on the land 12 in the shear direction is suppressed by the reinforcing patterns 14, it is possible to sufficiently ensure the shear strength of the solder ball 15.

Additionally, since the step portion G is formed between the land 12 and each reinforcing pattern 14, it is possible to prevent, upon formation of the solder ball external connection electrode terminal 15 on the land 12, molten solder from flowing on the pattern protective film 13 side along the reinforcing patterns 14.

Although the three reinforcing patterns 14 extend from the outer peripheral edge of the land 12 in the above embodiment, the number of the reinforcing patterns 14 may be suitably set in accordance with the desired shear strength of the external connection electrode terminal 15 or solder ball.

While the preferred embodiment of the present invention has been described using specific terms, such description is for illustrative purposes, and it is to be understood that changes and variations may be made without departing from the spirit or scope of the present invention.

What is claimed is:

1. A printed circuit board, comprising:
   lands formed in a wiring pattern at positions corresponding to formation positions of external connection electrode terminals;
   a pattern protective film having openings which are opened at said formation positions of said lands wherein the diameter of each of said openings of said pattern protective film is set to be larger than the outside diameter of each of said lands; and
   a reinforcing pattern which extends outwardly from an outer peripheral edge of each of said lands, the reinforcing pattern having an extension end wherein the extension end is covered with said pattern protective film.

2. A printed circuit board according to claim 1, wherein a plurality of reinforcing patterns are provided in such a manner as to extend radially outwardly from the outer peripheral edge of each of said lands.

3. A printed circuit board according to claim 1, wherein said reinforcing pattern is formed in such a manner as to be lower than each of said lands as measured from a vertical direction from said printed circuit board so as to form a step portion therebetween.

4. A semiconductor package using a printed circuit board, comprising:
   lands formed in a wiring pattern at positions corresponding to formation positions of external connection electrode terminals;
   a pattern protective film having openings which are opened at said formation positions of said lands wherein the diameter of each of said openings of said pattern protective film is set to be larger than the outside diameter of each of said lands;
   a semiconductor element mounted on said printed circuit board and electrically connected to said external connection electrode terminals via said wiring pattern; and
   a reinforcing pattern which extends outwardly from an outer peripheral edge of each of said lands, the reinforcing pattern having an extension end wherein the extension end is covered with said pattern protective film.

5. A semiconductor package according to claim 4, wherein a plurality of reinforcing patterns are provided in such a manner as to extend radially outwardly from the outer peripheral edge of each of said lands.

6. A semiconductor package according to claim 4, wherein said reinforcing pattern is formed in such a manner as to be lower than each of said lands as measured from a vertical direction from said printed circuit board so as to form a step portion therebetween.

7. The semiconductor package according to claim 4, wherein said external connection electrode terminals are spherically shaped.

8. The semiconductor package according to claim 4, wherein said external connection electrode terminals are solder balls.

9. A printed circuit board, comprising:
   at least one land formed in a wiring pattern at positions corresponding to formation positions of external connection electrode terminals;
   a pattern protective film having openings which are opened at said formation positions of said lands wherein the diameter of each of said openings of said pattern protective film is set to be larger than the outside diameter of each of said lands; and
   a plurality of reinforcing patterns which extend outwardly from an outer peripheral edge of each of said lands, each reinforcing pattern having an extension end wherein the extension end is covered with said pattern protective film, each reinforcing pattern being formed in such a manner as to be lower than each of said lands as measured from a vertical direction from said printed circuit board so as to form a step portion therebetween.

10. The circuit board according to claim 9, further comprising a semiconductor element electrically connected to said external connection electrode terminals.

* * * * *